(12) United States Patent
Lindquist et al.

(10) Patent No.: US 12,188,964 B2
(45) Date of Patent: *Jan. 7, 2025

(54) SPUR DETECTION IN A SAMPLED WAVEFORM IN A MIXED ANALOG/DIGITAL SYSTEM USING THE MAGNITUDE OF THE FREQUENCY RESPONSE

(71) Applicant: International Business Machines Corporation, Armonk, NY (US)

(72) Inventors: Timothy Lindquist, Rochester, MN (US); Paul E. Dahlen, Rochester, MN (US); George R. Zettles, IV, Rochester, MN (US); Layne A. Berge, Rochester, MN (US); Kent H. Haselhorst, Byron, MN (US); Daniel Ramirez, Rochester, MN (US); Sierra Spring, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/593,025

(22) Filed: Oct. 4, 2019

(65) Prior Publication Data
US 2021/0102976 A1   Apr. 8, 2021

(51) Int. Cl.
*G01R 13/02* (2006.01)
*G10L 21/14* (2013.01)

(52) U.S. Cl.
CPC .......... *G01R 13/0272* (2013.01); *G10L 21/14* (2013.01)

(58) Field of Classification Search
CPC .......................... G01R 13/0272; G10L 21/14
(Continued)

(56) References Cited

U.S. PATENT DOCUMENTS 7,328,195 B2  2/2008  Willis
8,098,779 B2  1/2012  Komninakis et al.
(Continued)

FOREIGN PATENT DOCUMENTS

CN   103946733 B  * 12/2017 .......... G01S 3/8036
EP      1402428 A1     3/2004
(Continued)

OTHER PUBLICATIONS

English translation of RU 2568326. 2015. (Year: 2015).*
(Continued)

*Primary Examiner* — Michael P Nghiem
(74) *Attorney, Agent, or Firm* — Erik Johnson

(57) ABSTRACT

Method, apparatus and computer program product for spur detection in a sampled waveform in a mixed analog/digital system using the magnitude of the frequency response comprising acquiring a sample waveform including a set of discrete uniformly spaced samples from a target system, wherein the sample waveform is a time domain vector; applying FFT transforming the time domain vector into the frequency domain; analyzing the frequency domain response including calculating the magnitude response; and determining whether the sample waveform has spurs including comparing the magnitude response to an average noise floor threshold including determining that the magnitude response having an average noise floor value above the average noise floor threshold has one or more spurs and determining that the magnitude response having an average noise floor value below the average noise floor threshold has no spurs, wherein a spur indicates unaligned data having a delayed bit flip.

12 Claims, 12 Drawing Sheets

(58) Field of Classification Search
USPC .......................................................... 702/66
See application file for complete search history.

(56) References Cited

U.S. PATENT DOCUMENTS

| | | | |
|---|---|---|---|
| 8,451,918 | B1 | 5/2013 | Cheng et al. |
| 9,429,625 | B1 | 8/2016 | Ding et al. |
| 9,685,969 | B1 | 6/2017 | Garg et al. |
| 9,759,772 | B2 | 9/2017 | Kaushansky et al. |
| 9,992,573 | B1* | 6/2018 | Meyer .................. H04R 3/04 |
| 10,312,927 | B1* | 6/2019 | Mirhaj ............... H03M 1/1014 |
| 10,355,706 | B1 | 7/2019 | Stein et al. |
| 2002/0105353 | A1* | 8/2002 | Mori ............... G01R 31/31716 |
| | | | 324/750.01 |
| 2007/0153878 | A1 | 7/2007 | Filipovic |
| 2008/0095384 | A1 | 4/2008 | Son et al. |
| 2009/0086864 | A1 | 4/2009 | Komninakis et al. |
| 2010/0237958 | A1 | 9/2010 | Goel et al. |
| 2011/0265051 | A1* | 10/2011 | Yeh ..................... G06F 30/367 |
| | | | 716/139 |
| 2014/0140440 | A1* | 5/2014 | Sun ..................... H04L 27/00 |
| | | | 375/316 |
| 2015/0124081 | A1 | 5/2015 | Jeong et al. |
| 2015/0153405 | A1 | 6/2015 | Wu et al. |
| 2015/0365095 | A1 | 12/2015 | Hossain et al. |
| 2016/0191232 | A1* | 6/2016 | Subburaj ............... G01S 7/4017 |
| | | | 342/195 |
| 2017/0257107 | A1* | 9/2017 | Laquai ................ H03M 1/0836 |
| 2018/0359126 | A1* | 12/2018 | Wang .................. H04L 27/2623 |
| 2019/0281386 | A1 | 9/2019 | Geiger et al. |
| 2020/0293860 | A1* | 9/2020 | Grassmann ............. G01S 7/417 |
| 2021/0102977 | A1* | 4/2021 | Lindquist ............ G10L 21/0232 |

FOREIGN PATENT DOCUMENTS

| | | | | |
|---|---|---|---|---|
| EP | 1456783 | A4 | 9/2006 | |
| EP | 1969726 | B1 | 9/2009 | |
| RU | 2568326 | C2 * | 11/2015 | ............. G01R 23/16 |
| WO | WO-2009090625 | A2 * | 7/2009 | ............ H03M 1/109 |

OTHER PUBLICATIONS

English translation of CN 103946733, Dec. 5, 2017. (Year: 2017).*
P201908320AUS01, Appendix P; List of IBM Patent or Applications Treated as Related, Oct. 4, 2019, 2 pages.
U.S. Appl. No. 16/593,471, to Timothy Lindquist et al., entitled, *Spur Detection in a Sampled Waveform in a Mixed Analog/Digital System Using the Phase of the Frequency Response*, assigned to International Business Machines Corporation, 36 pages, filed Oct. 4, 2019.
Definition of Phase Noise, everything RF, What is Phase Noise?, printed Dec. 31, 2023 (2023), 1 page.

* cited by examiner

SPUR DETECTION IN A SAMPLED WAVEFORM IN A MIXED ANALOG/DIGITAL SYSTEM USING THE MAGNITUDE OF THE FREQUENCY RESPONSE

BACKGROUND

Field of the Invention

The field of the present disclosure is high speed signaling in a mixed analog/digital system, or, more specifically, methods, apparatus, and products for detecting spurs in a sampled waveform in a mixed analog/digital system using the magnitude of the frequency response.

Description of Related Art

High speed parallel sampling interfaces are susceptible to data misalignment due to routing length differences between wires. Field Programmable Gate Arrays (FPGAs) are known for this problem, since every change made to a design forces rewiring on the entire chip. The resulting captured data may be filled with shifted bits having arrived late to sampling, often times being captured on following cycles. In the case of using this unaligned data for controlling parts that are sensitive to data timing, such as the output level of a digital-to-analog-converter (DAC) or analog-to-digital-converter (ADC), a time domain waveform x[n] will appear to instantaneously spike when an incorrect bit flip occurs. The phenomenon of a delayed bit flip causing unintended jumps is referred to as spurs and is an undesirable trait in most electrical systems. To resolve the induced timing issues, delay elements are added to resynchronize data at the end point. Having feedback on the existence of spurs is necessary to know a problem exists and further investigation is needed in the delay training phase for spur removal. Therefore, detecting the presence of spurs in the signal is desired.

SUMMARY

Methods, systems, and apparatus for detecting spurs in a sampled waveform in a mixed analog/digital system using the magnitude of the frequency response are disclosed in this specification. Methods, systems, and apparatus for detecting spurs in a sampled waveform in a mixed analog/digital system using the magnitude of the frequency response include acquiring a sample waveform including a set of discrete uniformly spaced samples from a target system, wherein the sample waveform is a time domain vector; applying FFT transforming the time domain vector into the frequency domain; analyzing the frequency domain response including calculating the magnitude response; and determining whether the sample waveform has spurs including comparing the magnitude response to a threshold including determining that the magnitude response having an average noise floor value above the average noise floor threshold has one or more spurs and determining that the magnitude response having an average noise floor value below the average noise floor threshold has no spurs, wherein a spur indicates unaligned data having a delayed bit flip.

The foregoing and other objects, features and advantages of the disclosure will be apparent from the following more particular descriptions of exemplary embodiments of the present disclosure as illustrated in the accompanying drawings wherein like reference numbers generally represent like parts of exemplary embodiments of the present disclosure.

DETAILED DESCRIPTION

Figure 1:
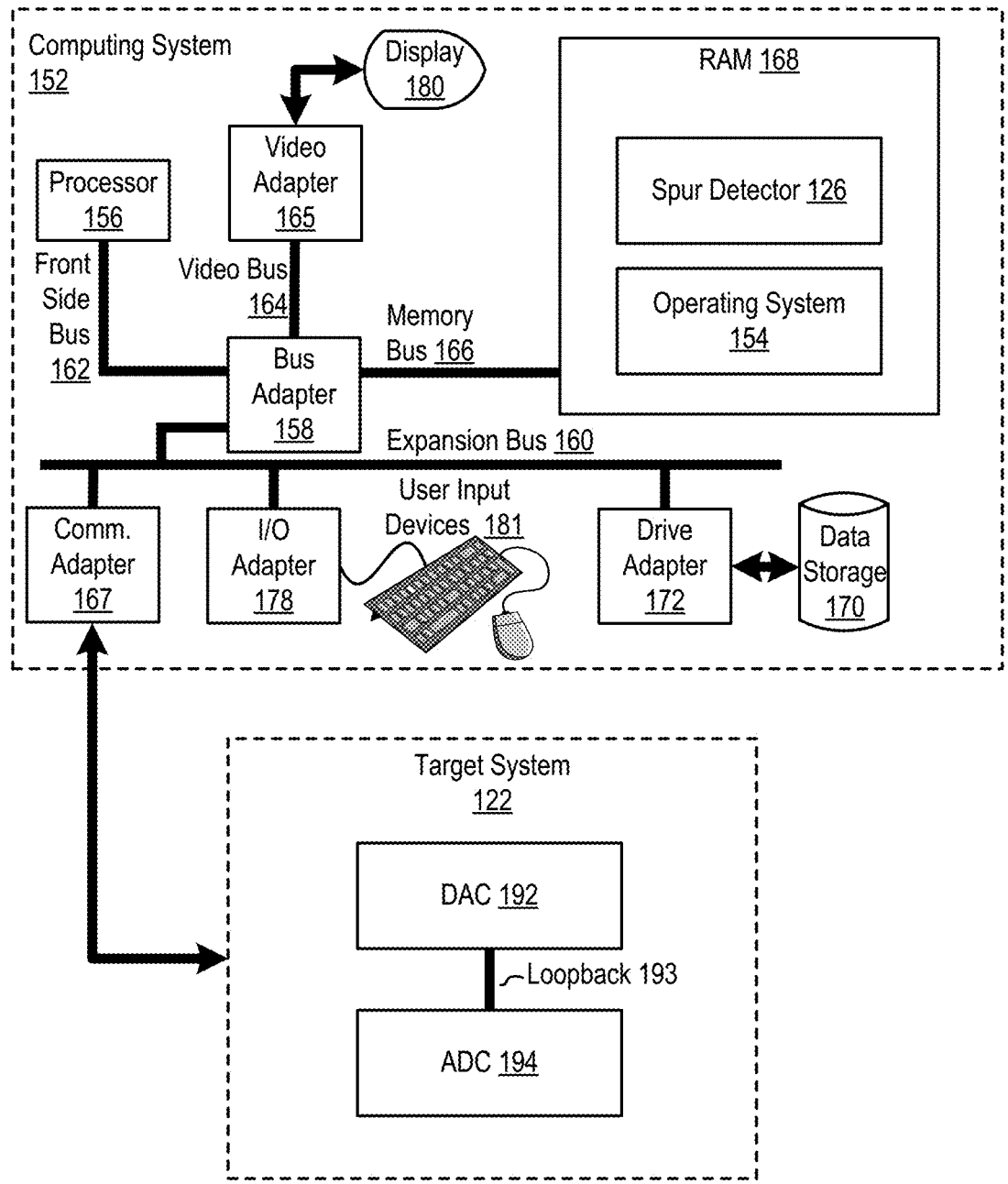
FIG. 1 sets a block diagram of automated computing machinery including an example computer useful in detecting spurs a sampled waveform in a mixed analog/digital system using the magnitude of the frequency response according to embodiments of the present disclosure.

Exemplary methods, apparatus, and products for detecting spurs in a sampled waveform in a mixed analog/digital system using the magnitude of the frequency response in accordance with the present disclosure are described with reference to the accompanying drawings, beginning with FIG. 1. FIG. 1 sets forth a block diagram of automated computing machinery comprising an exemplary computing system (152) or host processor configured for detecting spurs in a sampled waveform in a mixed analog/digital system using the magnitude of the frequency response according to embodiments of the present disclosure. The computing system (152) of FIG. 1 includes at least one computer processor (156) or "CPU" as well as random access memory (168) ("RAM") which is connected through a high speed memory bus (166) and bus adapter (158) to processor (156) and to other components of the computing system (152).

Stored in RAM (168) is an operating system (154). Operating systems useful in computers configured for detecting spurs in a sampled waveform in a mixed analog/digital system using the magnitude of the frequency response according to embodiments of the present disclosure include UNIX™, Linux™, Microsoft Windows™, AIX™, IBM's iOS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM (168) and part of the operating system is a spur detector (126), a module of computer program instructions for detecting spurs in a sampled waveform in a mixed analog/digital system using the magnitude of the frequency response.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of disk drive (170). Disk drive adapters useful in computers configured for detecting spurs in a sampled waveform in a mixed analog/digital system using the magnitude of the frequency response according to embodiments of the present disclosure include Integrated Drive Electronics ("IDE") adapters, Small Computer System Interface ("SCSI") adapters, and others as will occur to those of skill in the art. Non-volatile computer memory also may be implemented for as an optical disk drive, electrically erasable programmable read-only memory (so-called "EEPROM" or "Flash" memory), RAM drives, and so on, as will occur to those of skill in the art.

The example computing system (152) of FIG. 1 includes one or more input/output ("I/O") adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (165), which is an example of an I/O adapter specially designed for graphic output to a display device (180) such as a display screen or computer monitor. Video adapter (165) is connected to processor (156) through a high speed video bus (164), bus adapter (158), and the front side bus (162), which is also a high speed bus.

The exemplary computing system (152) of FIG. 1 includes a communications adapter (167) for data communications with other computers (182) and for data communications with a data communications network. Such data communications may be carried out serially through RS-232 connections, through external buses such as a Universal Serial Bus ("USB"), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for detecting spurs in a sampled waveform in a mixed analog/digital system using the magnitude of the frequency response according to embodiments of the present disclosure include modems for wired dial-up communications, Ethernet (IEEE 802.3) adapters for wired data communications, and 802.11 adapters for wireless data communications.

The communications adapter (167) of the exemplary computing system (152) of FIG. 1 is connected to a test probe (not shown) connected to a target system (122) via a communications bus. The target system (122) is a system that includes a DAC (192) and ADC (194) pair preferably configured in loopback. The loopback (193) could be a physical cable, an RF switch, or a tap/coupler, for example. The advantage of the tap/coupler is that the main path can be undisturbed and issues can be detected in real time.

As described above, in computing environments including digital and analog signals, bits are delayed or incorrectly flipped due to timing issues. These delayed bits or incorrectly flipped bits cause spurs. Unaligned digital going into a DAC or coming from an ADC create jumps or discontinuities in analog signals, referred to as spurs. Detecting the presence of spurs in the signal is desired.

Figure 2A:
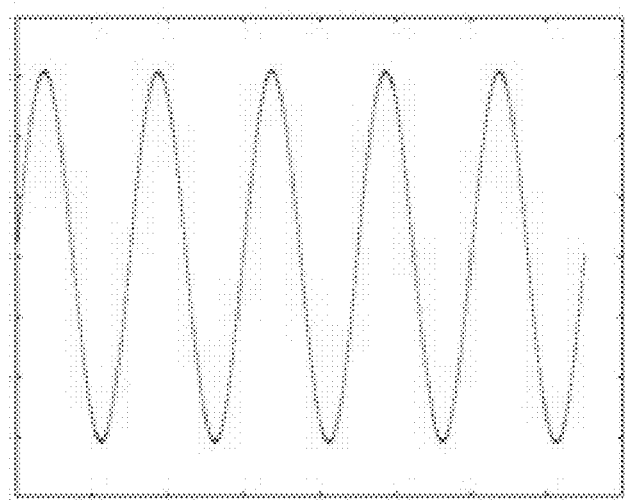
FIG. 2A sets forth a clean discrete time-domain sinusoid signal used in detecting spurs in a sampled waveform in a mixed analog/digital system using the magnitude of the frequency response according to embodiments of the present disclosure.
Figure 2B:
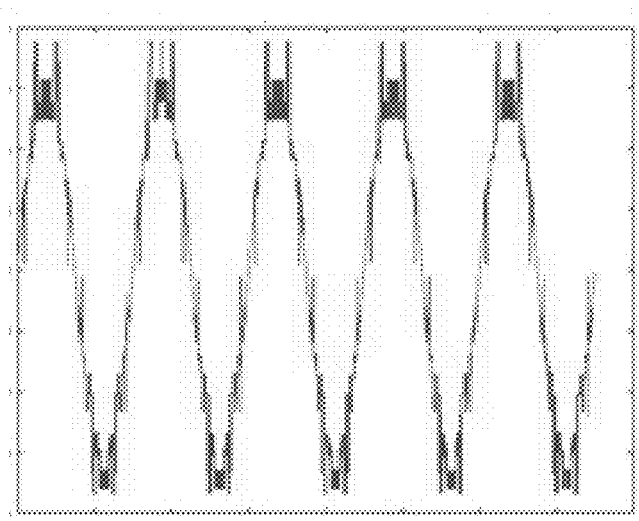
FIG. 2B sets forth a discrete time-domain sinusoid signal with spurs present for detecting spurs in a sampled waveform in a mixed analog/digital system using the magnitude of the frequency response according to embodiments of the present disclosure.

For further explanation, FIG. 2A sets forth a clean discrete time-domain sinusoid signal. FIG. 2B sets forth a discrete time-domain sinusoid signal with spurs present. The spurious signal of FIG. 2B contains spikes proportional to the significance of the bit flip that are periodic because of a constant wire length.

This periodicity can be exploited in the frequency domain through a set of transforms. First, the Discrete-time Fourier transform (DTFT) takes a set of discrete uniformly spaced samples and converts them into a continuous function representing periodicity over a set of frequencies. By convention in this paper, ( )=continuous, [ ]=discrete.

The Discrete-time Fourier transform (DTFT) equation is as follows:

$$X(\Omega) = \sum_{n=-\infty}^{\infty} x[n] e^{-j\omega n} X(\omega) = \sum_{n=-\infty}^{\infty} [n] e^{-j\omega n}$$

Where n is the discrete time samples
Where ω is the discrete time sampling frequency defined as: $\omega = \Omega T_s$
   $\Omega$ is the continuous time sampling frequency defined as: $\Omega = 2\pi f$
   $T_s$ is the sampling period.
The DTFT can be broken into its components as follows:

$$X(\omega) = X_R(\omega) + jX_i(\omega) = |X(\omega)| \angle X(\omega)$$

Where $X_R(\omega)$ contains the real values,
   $X_i(\omega)$ contains the imaginary values
   $|X(\omega)|$ is the magnitude response
   $\angle X(\omega)$ is the phase response.
In practice the DTFT is not used since it sums over an infinite series. Instead, the Discrete Fourier transform (DFT) is used to cover a finite set of captured samples.

The Discrete Fourier transform (DFT) equation is as follows:

$$X[k] = \sum_{n=0}^{N-1} x[n] e^{-\frac{j2\pi}{N}kn}$$

The DFT is computed using a Fast Fourier Transform (FFT) algorithm which offers computational time benefits over the DFT definition while reaching an identical result. Many implementations of the FFT algorithm are known.

The Fast Fourier Transform (FFT) responses are as follows:

$$\text{magnitude response: } |X[k]| = \sqrt{X_R[k]^2 + X_i[k]^2}$$

$$\text{phase response: } \angle X[k] = \tan^{-1}\left(\frac{X_i[k]}{X_R[k]}\right)$$

Figure 3A:
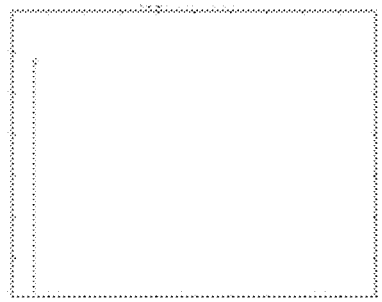
FIG. 3A sets forth a clean magnitude response used in detecting spurs in a sampled waveform in a mixed analog/digital system using the magnitude of the frequency response according to embodiments of the present disclosure.
Figure 3B:
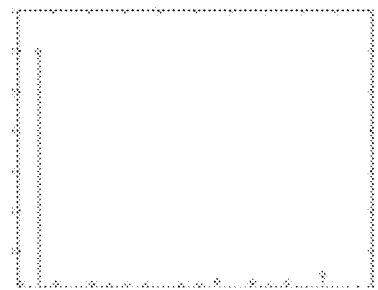
FIG. 3B sets forth a magnitude response with spurs present for detecting spurs in a sampled waveform in a mixed analog/digital system using the magnitude of the frequency response according to embodiments of the present disclosure.
Figure 3C:
FIG. 3C sets forth a clean logarithmic magnitude response used in detecting spurs in a sampled waveform in a mixed analog/digital system using the magnitude of the frequency response according to embodiments of the present disclosure.
Figure 3D:
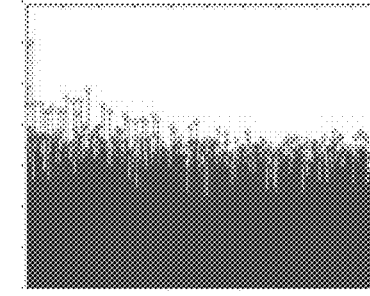
FIG. 3D sets forth a logarithmic magnitude response with spurs present for detecting spurs in a sampled waveform in a mixed analog/digital system using the magnitude of the frequency response according to embodiments of the present disclosure.
Figure 3E:
FIG. 3E sets forth a clean logarithmic magnitude response used in detecting spurs in a sampled waveform in a mixed analog/digital system using the magnitude of the frequency response according to embodiments of the present disclosure.
Figure 3F:
FIG. 3F sets forth a logarithmic magnitude response with spurs present for detecting spurs in a sampled waveform in a mixed analog/digital system using the magnitude of the frequency response according to embodiments of the present disclosure.

For further explanation, FIG. 3A sets forth the magnitude of the clean sinusoid from FIG. 2A. FIG. 3B sets forth the magnitude of the sinusoid with spurs present from FIG. 2B. The magnitude response can be used to detect spurs in the signal. In FIGS. 3A and 3B, the periodic frequency components are shown as vertical bars. The height is proportional to their dominance in the target waveform. The distinguishable vertical bar in FIGS. 3A and 3B represents the fundamental frequency of the sinusoid and all other bars are considered to be the noise floor. FIGS. 3C and 3D transform the y-axis of FIGS. 3A and 3B from a linear to logarithmic scale to magnify the differences between the responses. Similarly, FIGS. 3E and 3F transform the y-axis of FIGS. 3A and 3B from a linear to logarithmic scale to magnify the differences between the noise floors. There is a distinct separation of ≈1 decade between the average noise floor of the clean of FIG. 3E, shown as a horizontal line, and the average noise floor of the spurious waveform of FIG. 3F, shown as a horizontal line, with the spurious waveform of FIG. 3F having the higher average noise floor. Because of this, a thresholding technique can be used to distinguish the existence of spurs based off of the computed average noise floor height. The threshold could be set above the average noise floor of FIG. 3E, for example shown in FIG. 3G. Alternatively, the threshold could be set above a peak noise value of FIG. 3C excluding the fundamental frequency.

Figure 4:
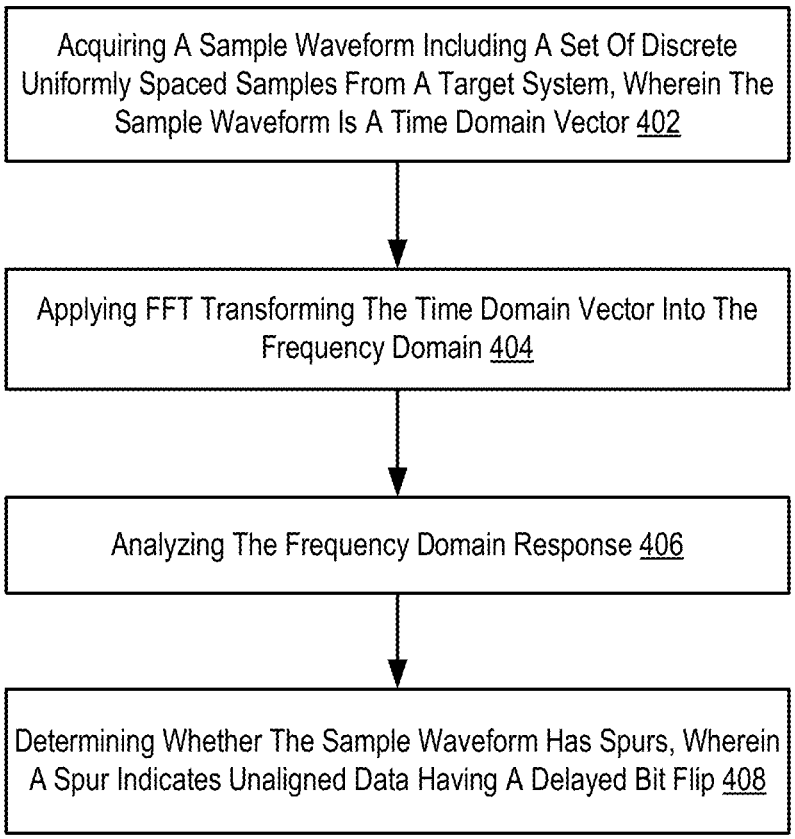
FIG. 4 sets forth a flow chart illustrating an exemplary method for detecting spurs in a sampled waveform in a mixed analog/digital system using the magnitude of the frequency response according to embodiments of the present disclosure.

For further explanation, FIG. 4 sets forth a flow chart illustrating an exemplary method for detecting spurs in a sampled waveform in a mixed analog/digital system using the magnitude of the frequency response according to embodiments of the present disclosure. The method of FIG. 4 includes acquiring (402) a sample waveform including a set of discrete uniformly spaced samples from a target system (126), wherein the sample waveform is a time domain vector. Acquiring the sample waveform from the target system (126) includes sampling the digital signal in a series of discrete, periodic, uniformly spaced samples as time domain vector. The sample waveform could be sampled from the target system (122) by a test probe connected to a host processor (152) or could be sampled as a part of the target system at a digital signal processor (DSP) located on or near an FPGA.

FIG. 4 also includes applying (404) an FFT transforming the time domain vector into the frequency domain. Applying an FFT algorithm to the time domain vector transforms the signal into the frequency domain. An FFT result is described above. The FFT could be applied to the time domain vector by a host processor (152) or could be applied by a DSP located on or near an FPGA in the target system.

FIG. 4 also includes analyzing (406) the frequency domain response. The frequency domain response could be analyzed by a host processor (152) or could be analyzed by a DSP located on or near an FPGA in the target system.

FIG. 4 also includes determining (408) whether the sample waveform has spurs, wherein a spur indicates unaligned data having a delayed bit flip. The determination whether the sample waveform has spurs could be made by a host processor (152) or could be made by a DSP located on an FPGA in the target system.

Figure 5:
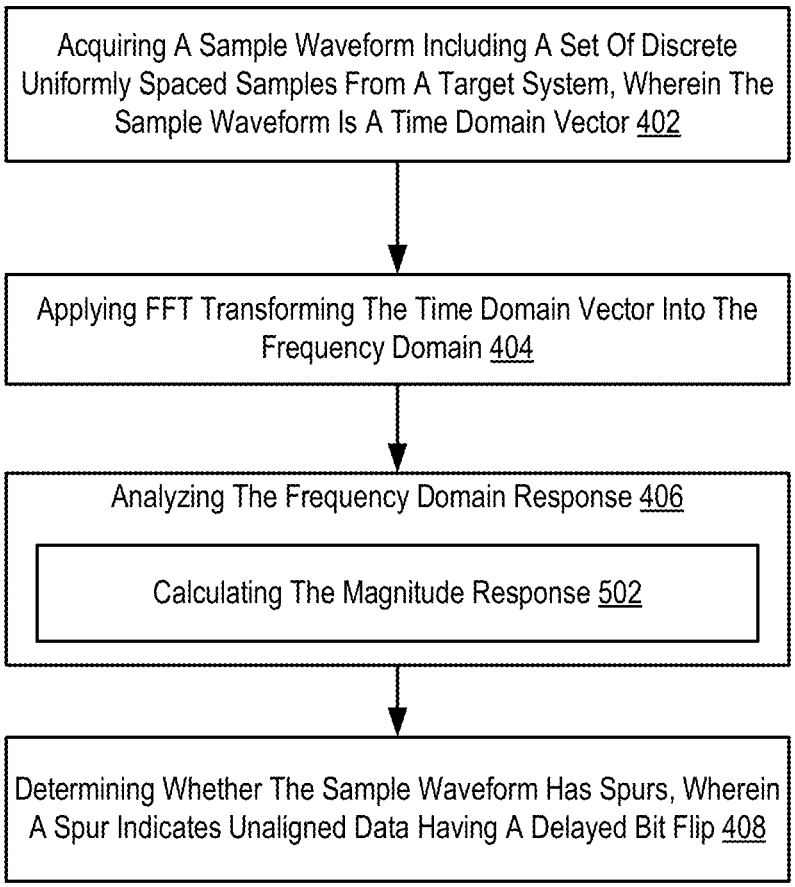
FIG. 5 sets forth a flow chart illustrating an exemplary method for detecting spurs in a sampled waveform in a mixed analog/digital system using the magnitude of the frequency response according to embodiments of the present disclosure.

For further explanation, FIG. 5 sets forth a flow chart illustrating an exemplary method for detecting spurs in a sampled waveform in a mixed analog/digital system using the magnitude of the frequency response according to embodiments of the present disclosure that includes acquiring (402) a sample waveform including a set of discrete uniformly spaced samples from a target system (126), wherein the sample waveform is a time domain vector; applying (404) an FFT transforming the time domain vector into the frequency domain; analyzing (406) the frequency domain response; and determining (408) whether the sample waveform has spurs, wherein a spur indicates unaligned data having a delayed bit flip.

The method of FIG. 5 differs from the method of FIG. 4, however, in that analyzing (406) the frequency domain response also includes calculating (502) the magnitude response. Calculating (402) the magnitude response was described above and includes calculating the magnitude portion of the frequency domain response. The magnitude response could be calculated by a host processor (152) or could be calculated by a DSP located on or near an FPGA in the target system.

Figure 6:
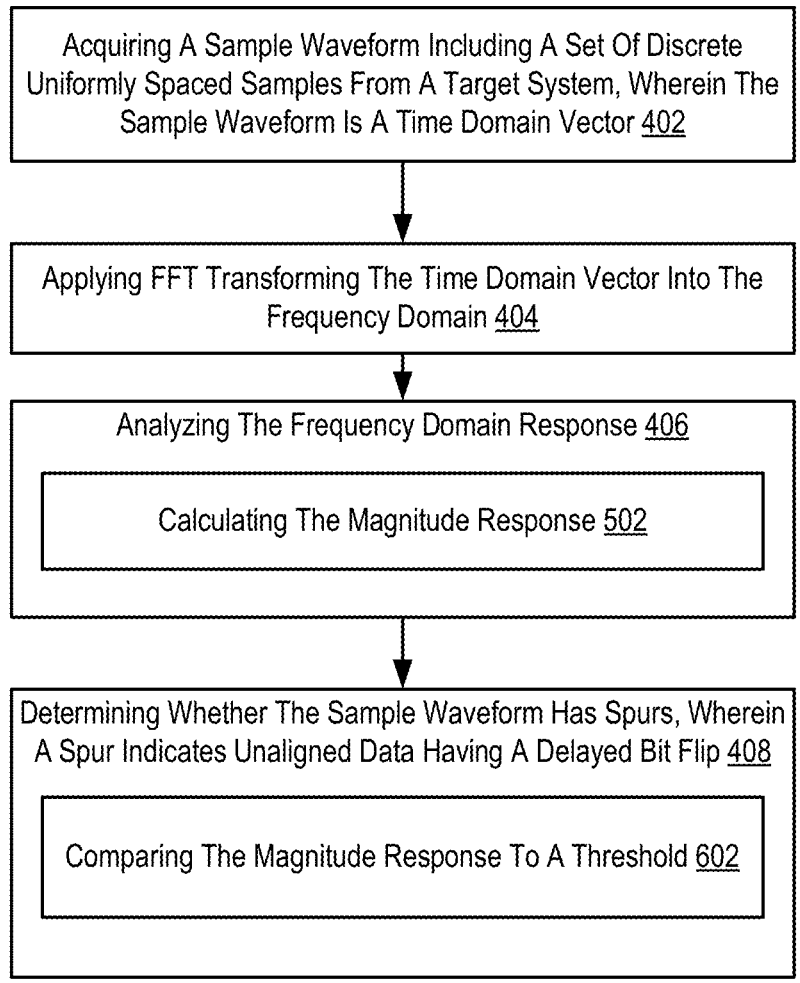
FIG. 6 sets forth a flow chart illustrating an exemplary method for detecting spurs in a sampled waveform in a mixed analog/digital system using the magnitude of the frequency response according to embodiments of the present disclosure.

For further explanation, FIG. 6 sets forth a flow chart illustrating an exemplary method for detecting spurs in a sampled waveform in a mixed analog/digital system using the magnitude of the frequency response according to embodiments of the present disclosure that includes acquiring (402) a sample waveform including a set of discrete uniformly spaced samples from a target system (126), wherein the sample waveform is a time domain vector; applying (404) an FFT transforming the time domain vector into the frequency domain; analyzing (406) the frequency domain response including calculating (502) the magnitude response; and determining (408) whether the sample waveform has spurs, wherein a spur indicates unaligned data having a delayed bit flip.

Figure 3G:
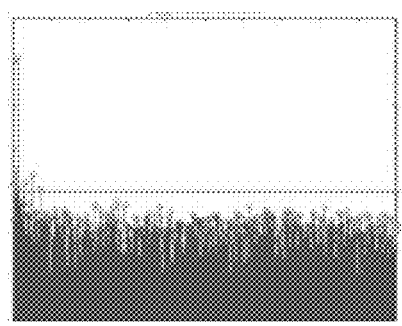
FIG. 3G sets forth a clean logarithmic magnitude response and a logarithmic magnitude response with spurs present for detecting spurs in a sampled waveform in a mixed analog/digital system using the magnitude of the frequency response according to embodiments of the present disclosure.
Figure 3G:
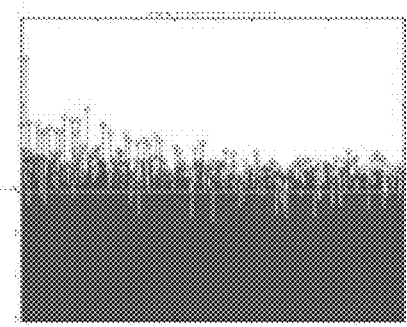

The method of FIG. 6 differs from the method of FIGS. 4 and 5, however, in that determining (408) whether the sample waveform has spurs, wherein a spur indicates unaligned data having a delayed bit flip includes comparing (602) the magnitude response to a threshold. The determination whether the sample waveform has spurs could be made by a host processor (152) or could be made by a DSP located on an FPGA in the target system. As described above with reference to FIGS. 3E, 3F, and 3G, the magnitude response of the transformed sample waveform has an average noise floor. The average noise floor threshold could be set above the average noise floor of as shown in FIG. 3G, for example. Alternatively, the threshold could be set above a peak noise value of FIG. 3C excluding the fundamental frequency.

Figure 7:
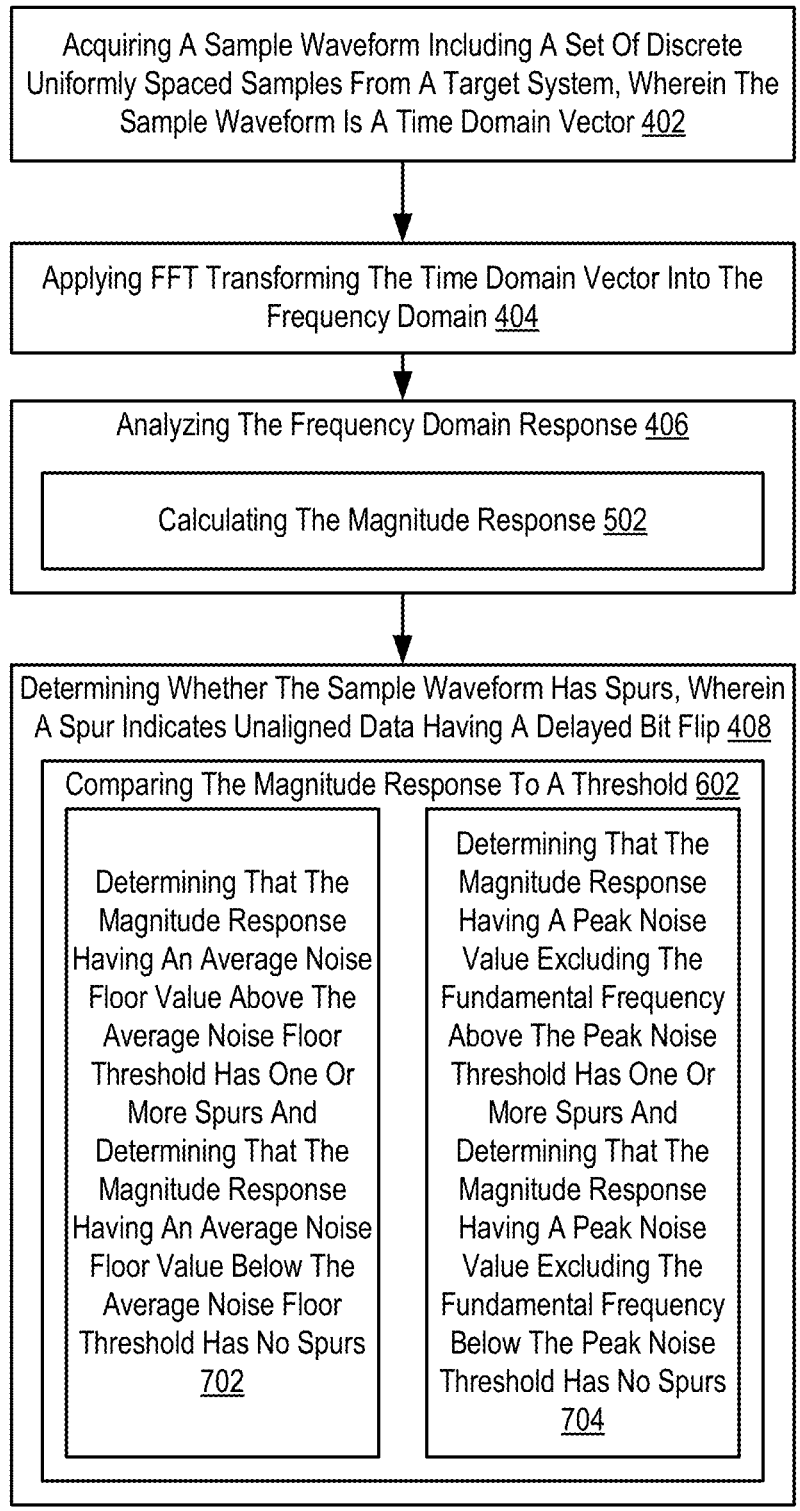
FIG. 7 sets forth a flow chart illustrating an exemplary method for detecting spurs in a sampled waveform in a mixed analog/digital system using the magnitude of the frequency response according to embodiments of the present disclosure.

For further explanation, FIG. 7 sets forth a flow chart illustrating an exemplary method for detecting spurs in a sampled waveform in a mixed analog/digital system using the magnitude of the frequency response according to embodiments of the present disclosure that includes acquiring (402) a sample waveform including a set of discrete uniformly spaced samples from a target system (126), wherein the sample waveform is a time domain vector; applying (404) an FFT transforming the time domain vector into the frequency domain; analyzing (406) the frequency domain response including calculating (502) the magnitude response; and determining (408) whether the sample waveform has spurs, including comparing (602) the magnitude response to an average noise floor threshold, wherein a spur indicates unaligned data having a delayed bit flip.

The method of FIG. 7 differs from the method of FIGS. 4, 5, and 6, however, in that determining (408) whether the sample waveform has spurs, wherein a spur indicates unaligned data having a delayed bit flip including comparing (602) the magnitude response to an average noise floor threshold includes determining (702) that the magnitude response having an average noise floor value above the average noise floor threshold has one or more spurs and determining that the magnitude response having an average noise floor value below the average noise floor threshold has no spurs. The determination whether the sample waveform has spurs could be made by a host processor (152) or could be made by a DSP located on an FPGA in the target system. As described above with reference to FIGS. 3E, 3F, and 3G, the magnitude response of the transformed sample waveform has an average noise floor. The average noise floor threshold could be set above the average noise floor of as shown in FIG. 3G, for example. When the average noise floor value of the magnitude response is compared to the average noise floor threshold, if the average noise floor value of the magnitude response is greater than the average noise floor threshold, then it is determined that the sample waveform has one or more spurs in the signal. When the average noise floor value of the magnitude response is compared to the average noise floor threshold, if the average noise floor value of the magnitude response is less than the average noise floor threshold, then it is determined that the sample waveform has no spurs.

FIG. 7 also includes an alternate embodiment, determining (408) whether the sample waveform has spurs, wherein a spur indicates unaligned data having a delayed bit flip including comparing (602) the magnitude response to an average noise floor threshold includes determining (704) that the magnitude response having a peak noise value excluding the fundamental frequency above the peak noise threshold has one or more spurs and determining that the magnitude response having a peak noise value excluding the fundamental frequency below the peak noise threshold has no spurs. The threshold could be set above a peak noise value of FIG. 3C excluding the fundamental frequency. When the peak noise value of the magnitude response excluding the fundamental frequency is compared to the peak noise threshold, if the peak noise value of the magnitude response excluding the fundamental frequency is greater than the peak noise threshold, then it is determined that the sample waveform has one or more spurs in the signal. When the peak noise value of the magnitude response excluding the fundamental frequency is compared to the peak noise threshold, if the peak noise value of the magnitude response excluding the fundamental frequency is less than the peak noise threshold, then it is determined that the sample waveform has no spurs.

Figure 8:
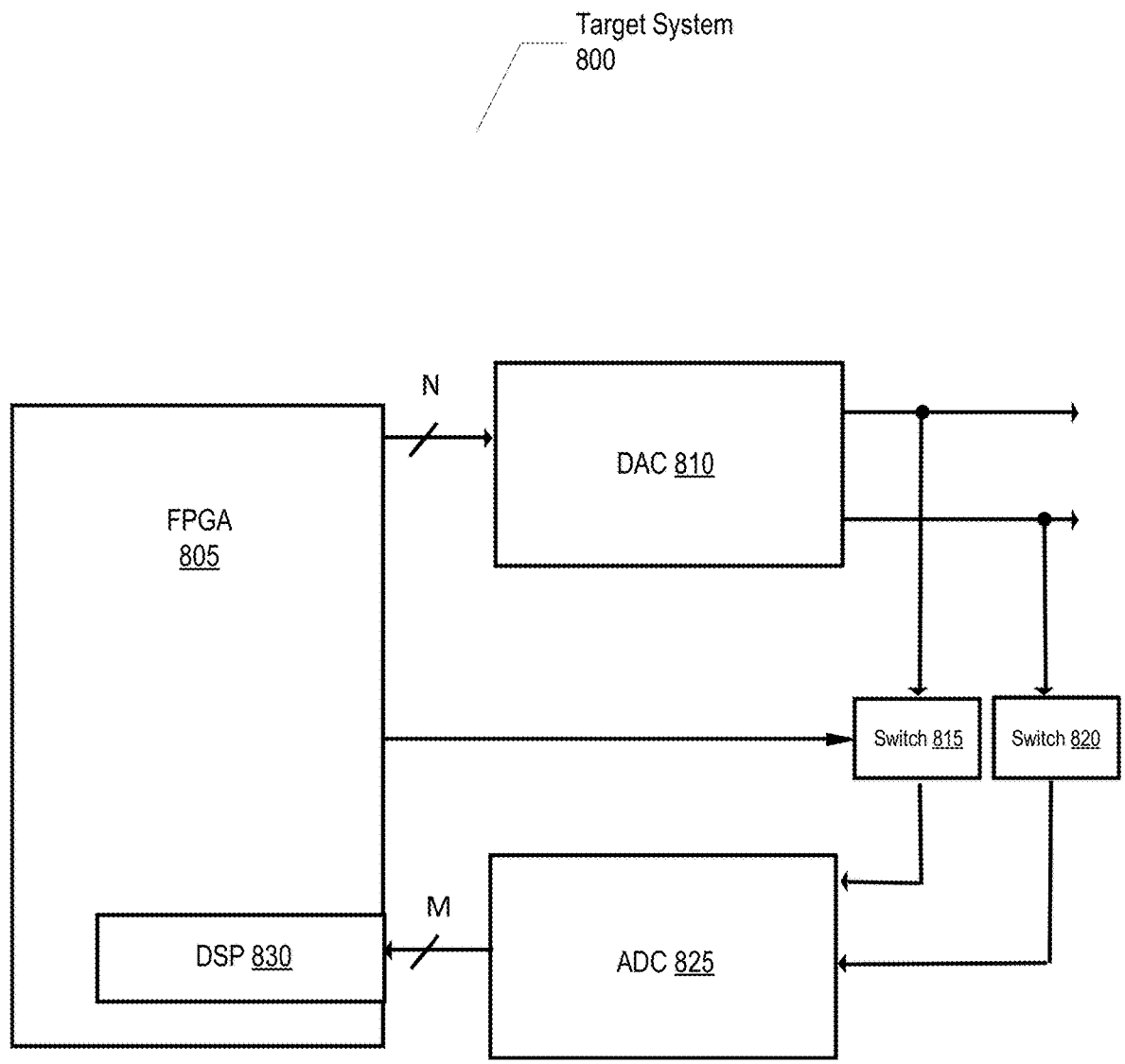
FIG. 8 sets forth an exemplary target system useful in detecting spurs in a sampled waveform in a mixed analog/digital system using the magnitude of the frequency response according to embodiments of the present disclosure.

For further explanation, FIG. 8 sets forth an exemplary target system (800) for detecting spurs in a sampled waveform in a mixed analog/digital system using the magnitude of the frequency response according to embodiments of the present disclosure. Target system (800) includes an FPGA (805) that sends N high speed parallel signals to DAC (810). DAC (810) has multiple analog outputs that are selected by FPGA (805) at selectable analog switch (815) and selectable analog switch (820) as input to ADC (825). ADC (825) sends M digital signals to DSP (830). Target system (800) may include other combinations of modules not shown.

FPGA (805) can be a semiconductor device with multiple configurable and reprogrammable logic blocks connected by interconnects. Each time that FPGA (805) is reprogrammed with a newly implemented design (small changes in a design require rerouting that could be implemented completely differently by the tool), various timing delays are introduced. Additionally, each time that FPGA (805) is powered off and powered on, some settings are lost and must be retrained.

DAC (810) receives a digital signal from FPGA (805) and converts the digital signal to an analog signal. Any bit errors or unaligned data will result in instantaneous jumps in the analog signal and overall signal degradation. DAC (810) has multiple analog outputs.

ADC (825) receives the selected analog signal and converts the analog signal to a digital signal. Because the conversion involves quantization of the analog input, there is necessarily a small amount of noise introduced. Misalignments or spurs in the signal also may also be added to the output.

DSP (830) can be a specialized microprocessor that receives M digital signals from ADC (825) and detects spurs in the signal. DSP (830) can detect spurs in the signal by acquiring (402) a sample waveform including a set of discrete uniformly spaced samples from target system (800), wherein the sample waveform is a time domain vector; applying (404) an FFT transforming the time domain vector into the frequency domain; analyzing (406) the frequency domain response including calculating (502) the magnitude response; and determining (408) whether the sample waveform has spurs, including comparing (602) the magnitude response to a threshold, wherein a spur indicates unaligned data having a delayed bit flip. As described above with reference to FIGS. 3E, 3F, and 3G, the magnitude response of the transformed sample waveform has an average noise floor. The average noise floor threshold could be set above the average noise floor of as shown in FIG. 3G, for example. When the average noise floor value of the magnitude response is compared to the average noise floor threshold, if the average noise floor value of the magnitude response is greater than the average noise floor threshold, then it is determined (702) that the sample waveform has one or more spurs in the signal. When the average noise floor value of the magnitude response is compared to the average noise floor threshold, if the average noise floor value of the magnitude response is less than the average noise floor threshold, then it is determined that the sample waveform has no spurs.

In an alternate embodiment, the threshold could be set above a peak noise value of FIG. 3C excluding the fundamental frequency. When the peak noise value of the magnitude response excluding the fundamental frequency is compared to the peak noise threshold, if the peak noise value of the magnitude response excluding the fundamental frequency is greater than the peak noise threshold, then it is determined (704) that the sample waveform has one or more spurs in the signal. When the peak noise value of the magnitude response excluding the fundamental frequency is compared to the peak noise threshold, if the peak noise value of the magnitude response excluding the fundamental frequency is less than the peak noise threshold, then it is determined that the sample waveform has no spurs.

Figure 9:
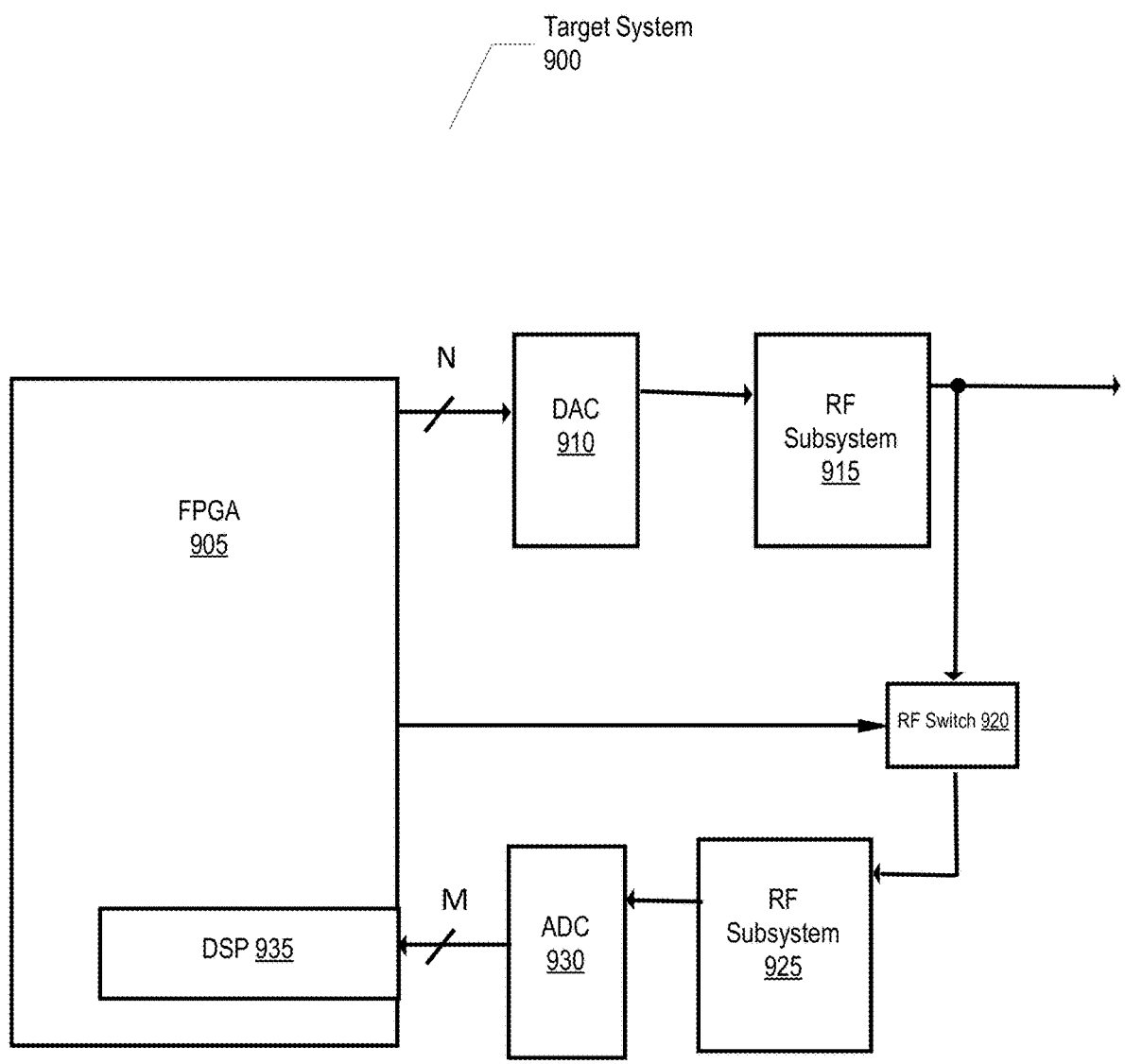
FIG. 9 sets forth an exemplary target system useful in detecting spurs in a sampled waveform in a mixed analog/digital system using the magnitude of the frequency response according to embodiments of the present disclosure.

For further explanation, FIG. 9 sets forth an exemplary target system (900) for detecting spurs in a sampled waveform in a mixed analog/digital system using the magnitude of the frequency response according to embodiments of the present disclosure. Similar to target system (800) in FIG. 8, target system (900) includes an FPGA (905) that sends N high speed parallel signals to DAC (910). DAC (910) has multiple analog outputs that are selected by FPGA (905) at selectable RF switch (920) as input to ADC (930). ADC (930) sends M digital signals to DSP (935). Target system (900) may include other combinations of modules not shown.

Target system (900) of FIG. 9 differs from target system (800) of FIG. 8, however, in that DAC (910) sends an analog signal to RF subsystem (915) that in turn sends an RF signal to RF subsystem (925). RF subsystem (925) sends an analog signal to ADC (930) that converts the analog signal to digital and sends M digital signals to DSP (935) for spur detection.

RF subsystem (915) and RF subsystem (925) may be microwave components, RF mixers, or other RF subsystems that operate with analog signals. RF subsystem (915) may transmit RF signals and RF subsystem (925) may receive RF signals.

Similar to DSP (830) described above, DSP (935) can detect spurs in the signal by acquiring (402) a sample waveform including a set of discrete uniformly spaced samples from target system (900), wherein the sample waveform is a time domain vector; applying (404) an FFT transforming the time domain vector into the frequency domain; analyzing (406) the frequency domain response including calculating (502) the magnitude response; and determining (408) whether the sample waveform has spurs, including comparing (602) the magnitude response to an average noise floor threshold, wherein a spur indicates unaligned data having a delayed bit flip. As described above with reference to FIGS. 3E, 3F, and 3G, the magnitude response of the transformed sample waveform has an average noise floor. The average noise floor threshold could be set above the average noise floor of as shown in FIG. 3G, for example. When the average noise floor value of the magnitude response is compared to the average noise floor threshold, if the average noise floor value of the magnitude response is greater than the average noise floor threshold, then it is determined (702) that the sample waveform has one or more spurs in the signal. When the average noise floor value of the magnitude response is compared to the average noise floor threshold, if the average noise floor value of the magnitude response is less than the average noise floor threshold, then it is determined that the sample waveform has no spurs.

In an alternate embodiment, the threshold could be set above a peak noise value of FIG. 3C excluding the fundamental frequency. When the peak noise value of the magnitude response excluding the fundamental frequency is compared to the peak noise threshold, if the peak noise value of the magnitude response excluding the fundamental frequency is greater than the peak noise threshold, then it is determined (704) that the sample waveform has one or more spurs in the signal. When the peak noise value of the magnitude response excluding the fundamental frequency is compared to the peak noise threshold, if the peak noise value of the magnitude response excluding the fundamental frequency is less than the peak noise threshold, then it is determined that the sample waveform has no spurs.

Figure 10:
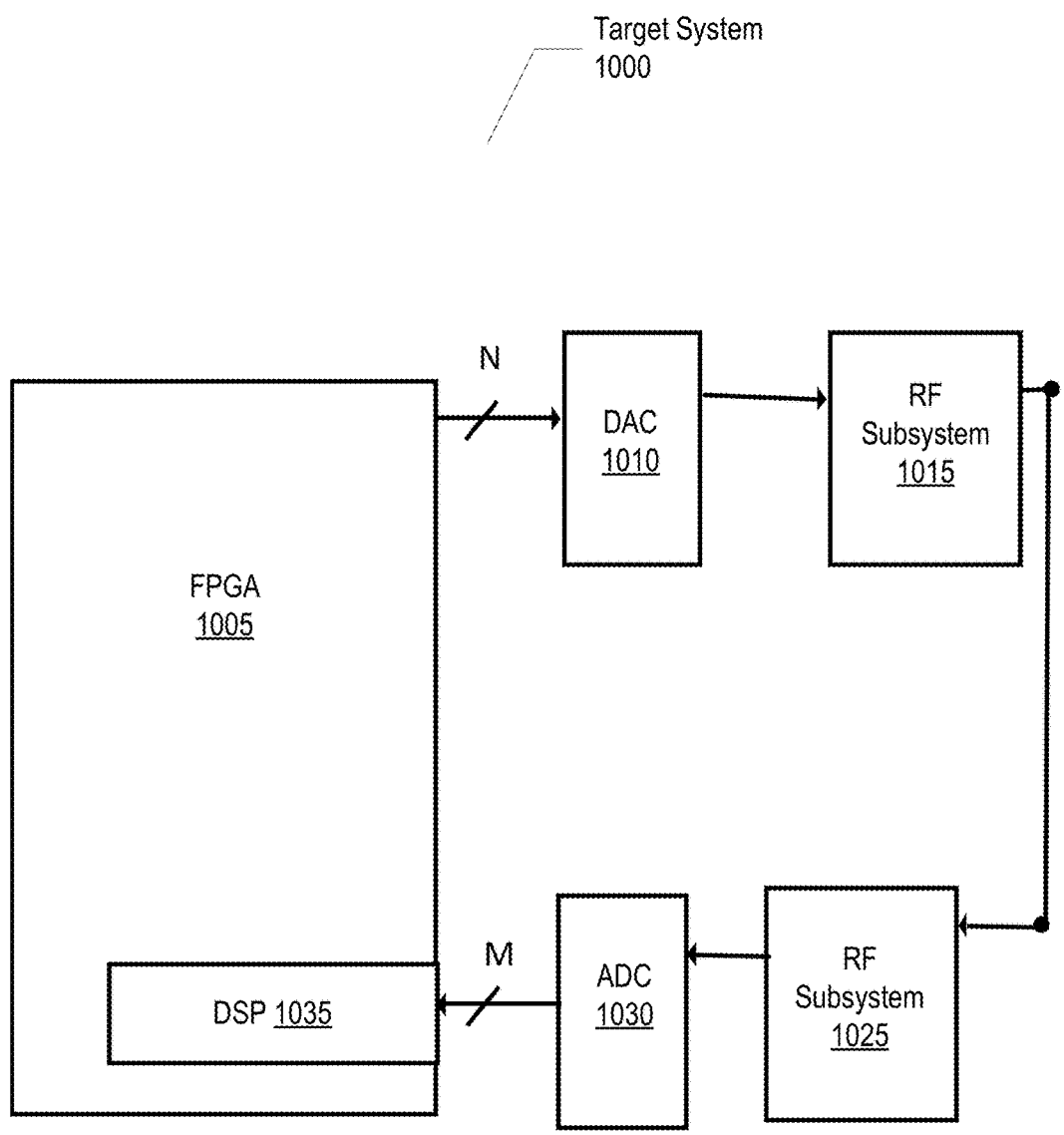
FIG. 10 sets forth an exemplary target system useful in detecting spurs in a sampled waveform in a mixed analog/digital system using the magnitude of the frequency response according to embodiments of the present disclosure.

For further explanation, FIG. 10 sets forth an exemplary target system (1000) for detecting spurs in a sampled waveform in a mixed analog/digital system using the magnitude of the frequency response according to embodiments of the present disclosure. Similar to target system (800) in FIG. 8 and target system (900) in FIG. 9, target system (1000) includes an FPGA (1005) that sends N high speed parallel signals to DAC (1010). DAC (1010) sends an analog signal to RF subsystem (1015) that in turn sends an RF signal to RF subsystem (1025). RF subsystem (1025) sends an analog signal to ADC (1030) that converts the analog signal to digital and sends M digital signals to DSP (1035) for spur detection. Target system (1000) may include other combinations of modules not shown.

Target system (1000) differs from target system (800) in FIG. 8 and target system (900) in FIG. 9, however, in that there is no analog switch and no RF switch.

Similar to DSP (830) described above, DSP (1035) can detect spurs in the signal by acquiring (402) a sample waveform including a set of discrete uniformly spaced samples from target system (1000), wherein the sample waveform is a time domain vector; applying (404) an FFT transforming the time domain vector into the frequency domain; analyzing (406) the frequency domain response including calculating (502) the magnitude response; and determining (408) whether the sample waveform has spurs, including comparing (602) the magnitude response to an average noise floor threshold, wherein a spur indicates unaligned data having a delayed bit flip. As described above with reference to FIGS. 3E, 3F, and 3G, the magnitude response of the transformed sample waveform has an average noise floor. The average noise floor threshold could be set above the average noise floor of as shown in FIG. 3G, for example. When the average noise floor value of the magnitude response is compared to the average noise floor threshold, if the average noise floor value of the magnitude response is greater than the average noise floor threshold, then it is determined (702) that the sample waveform has one or more spurs in the signal. When the average noise floor value of the magnitude response is compared to the average noise floor threshold, if the average noise floor value of the magnitude response is less than the average noise floor threshold, then it is determined that the sample waveform has no spurs.

In an alternate embodiment, the threshold could be set above a peak noise value of FIG. 3C excluding the fundamental frequency. When the peak noise value of the magnitude response excluding the fundamental frequency is compared to the peak noise threshold, if the peak noise value of the magnitude response excluding the fundamental frequency is greater than the peak noise threshold, then it is determined (704) that the sample waveform has one or more spurs in the signal. When the peak noise value of the magnitude response excluding the fundamental frequency is compared to the peak noise threshold, if the peak noise value of the magnitude response excluding the fundamental frequency is less than the peak noise threshold, then it is determined that the sample waveform has no spurs.

Figure 11:
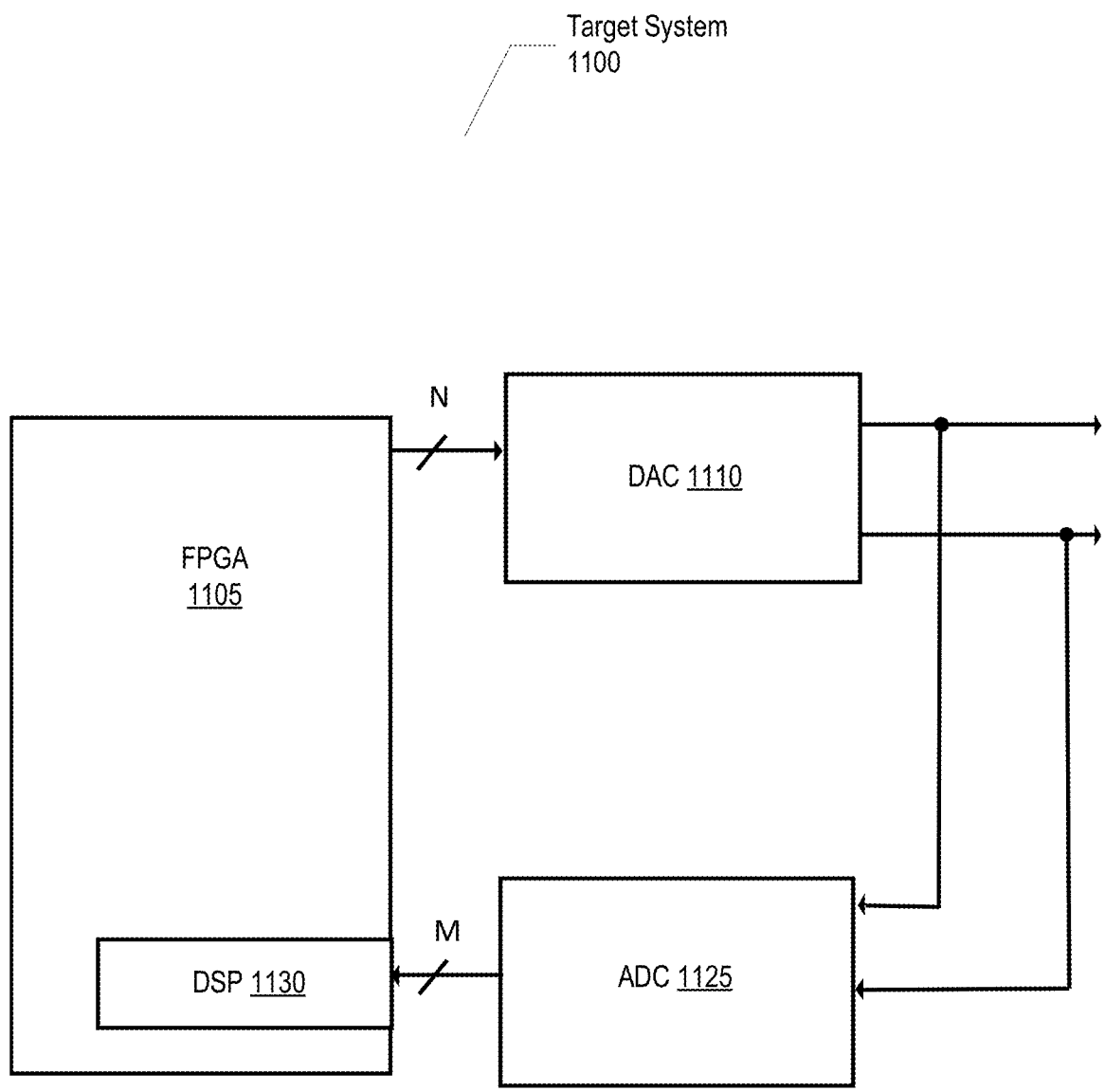
FIG. 11 sets forth an exemplary target system useful in detecting spurs in a sampled waveform in a mixed analog/digital system using the magnitude of the frequency response according to embodiments of the present disclosure.

For further explanation, FIG. 11 sets forth an exemplary target system (1100) for detecting spurs in a sampled waveform in a mixed analog/digital system using the magnitude of the frequency response according to embodiments of the present disclosure. Similar to target system (800) in FIG. 8, target system (1100) includes an FPGA (1105) that sends N high speed parallel signals to DAC (1110). DAC (1110) sends an analog signal to ADC (1125) that converts the analog signal to digital and sends M digital signals to DSP (1130) for spur detection. Target system (1100) may include other combinations of modules not shown.

Target system (1100) differs from target system (800) in FIG. 8 and target system (900) in FIG. 9, however, in that there is no analog switch and no RF switch.

Similar to DSP (830) described above, DSP (1130) can detect spurs in the signal by acquiring (402) a sample waveform including a set of discrete uniformly spaced samples from target system (1100), wherein the sample waveform is a time domain vector; applying (404) an FFT transforming the time domain vector into the frequency domain; analyzing (406) the frequency domain response including calculating (502) the magnitude response; and determining (408) whether the sample waveform has spurs, including comparing (602) the magnitude response to an average noise floor threshold, wherein a spur indicates unaligned data having a delayed bit flip. As described above with reference to FIGS. 3E, 3F, and 3G, the magnitude response of the transformed sample waveform has an average noise floor. The average noise floor threshold could be set above the average noise floor of as shown in FIG. 3G, for example. When the average noise floor value of the magnitude response is compared to the average noise floor threshold, if the average noise floor value of the magnitude response is greater than the average noise floor threshold, then it is determined (702) that the sample waveform has one or more spurs in the signal. When the average noise floor value of the magnitude response is compared to the average noise floor threshold, if the average noise floor value of the magnitude response is less than the average noise floor threshold, then it is determined that the sample waveform has no spurs.

In an alternate embodiment, the threshold could be set above a peak noise value of FIG. 3C excluding the fundamental frequency. When the peak noise value of the magnitude response excluding the fundamental frequency is compared to the peak noise threshold, if the peak noise value of the magnitude response excluding the fundamental frequency is greater than the peak noise threshold, then it is determined (704) that the sample waveform has one or more spurs in the signal. When the peak noise value of the magnitude response excluding the fundamental frequency is compared to the peak noise threshold, if the peak noise value of the magnitude response excluding the fundamental frequency is less than the peak noise threshold, then it is determined that the sample waveform has no spurs.

Figure 12:
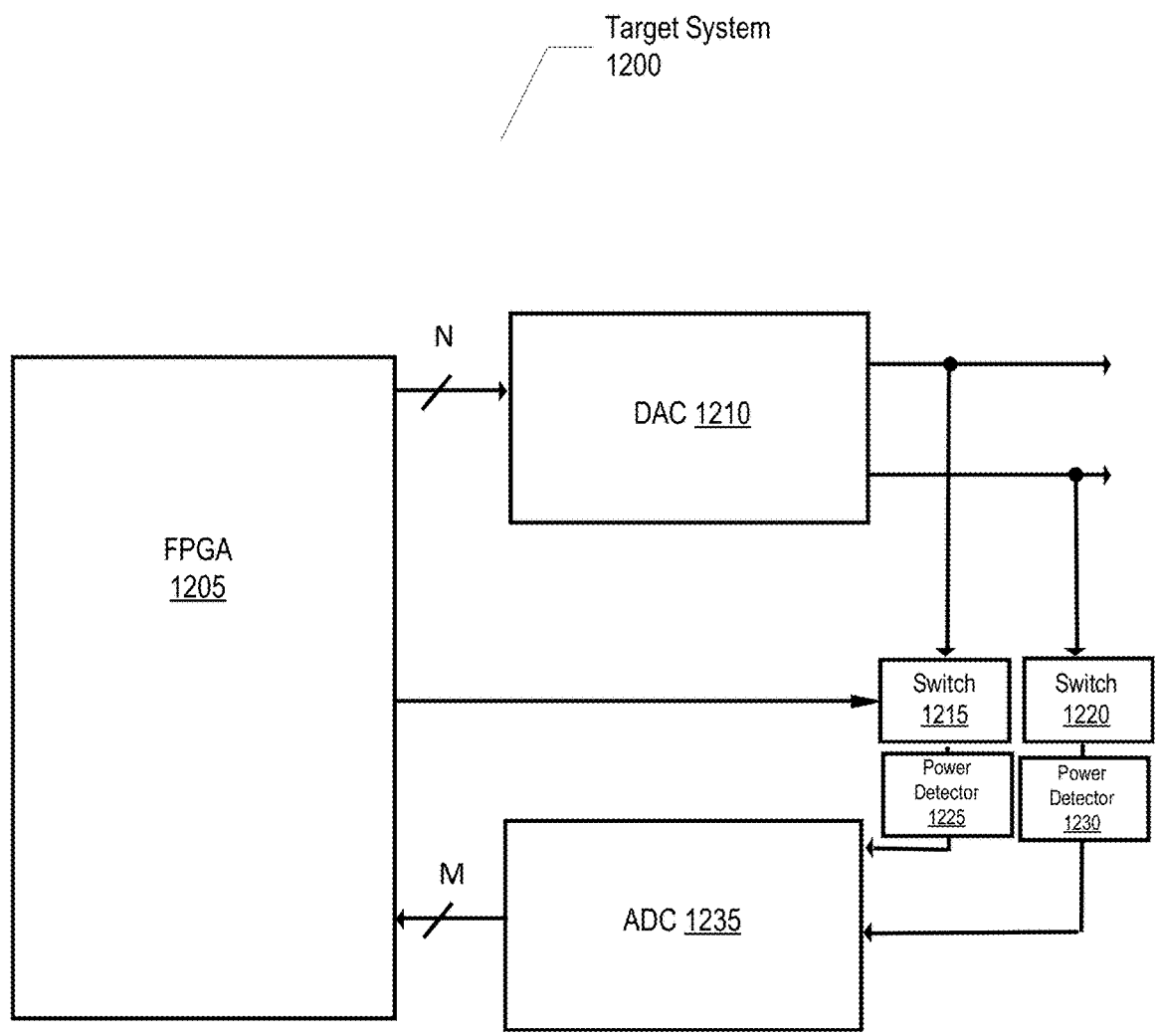
FIG. 12 sets forth an exemplary target system useful in detecting spurs in a sampled waveform in a mixed analog/digital system using the magnitude of the frequency response according to embodiments of the present disclosure.

For further explanation, FIG. 12 sets forth an exemplary target system (1200) for detecting spurs in a sampled waveform in a mixed analog/digital system using the magnitude of the frequency response according to embodiments of the present disclosure. Similar to target system (800) in FIG. 8, target system (1200) includes an FPGA (1205) that sends N high speed parallel signals to DAC (1210). DAC (1210) has multiple analog outputs that are selected by FPGA (1205) at selectable analog switch (1215) and selectable analog switch (1220) as input to ADC (1235). ADC (1235) converts the analog signal to digital and sends M digital signals to FPGA (1205). Target system (1200) may include other combinations of modules not shown.

Target system (1200) differs from target system (800) in FIG. 8 and target system (900) in FIG. 9, however, in that power detector (1225) and power detector (1230) are between DAC (1210) and ADC (1235). There is no DSP in target system (1200). Instead, power detector (1225) and power detector (1230) can be used to detect signal noise floor values above an average noise floor threshold or a peak noise threshold.

In view of the explanations set forth above, readers will recognize that the benefits of detecting spurs in a sampled waveform in a mixed analog/digital system using the magnitude of the frequency response according to embodiments of the present disclosure include:

Detecting the presence of one or more spurs in a signal or no spurs.

Efficiently detecting spurs in a signal with minimal computation.

Exemplary embodiments of the present disclosure are described largely in the context of a fully functional computer system for detecting spurs in a sampled waveform in a mixed analog/digital system using the magnitude of the frequency response. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method comprising:
   converting, by a target system, an analog signal to a digital signal, wherein the target system includes a digital to analog converter (DAC) and analog to digital converter (ADC) pair;
   by program instructions on a computing device,
   acquiring, from the digital signal, a sample waveform including a set of discrete uniformly spaced samples from the target system, wherein the sample waveform is a time domain vector;
   applying FFT transforming the time domain vector into a frequency domain;
   analyzing the frequency domain response including calculating a magnitude response; and
   determining, based on comparing a noise value of the magnitude response to an average noise floor threshold, whether the sample waveform has spurs, including determining that the sample waveform has no spurs when the noise value of the magnitude response is below the average noise floor threshold and determining that the sample waveform has one or more spurs when the noise value of the magnitude response is above the average noise floor threshold, wherein a spur indicates unaligned data having a delayed bit flip.

2. The method of claim 1, wherein the DAC and ADC pair in the target system are in a loopback connection.

3. The method of claim 2, wherein the sample waveform is acquired from an output of the DAC.

4. The method of claim 2, wherein the sample waveform is acquired from an output of the ADC.

5. An apparatus comprising:
   a target system configured to carry out converting an analog signal to a digital signal, wherein the target system includes a digital to analog converter (DAC) and analog to digital converter (ADC) pair;
   a computer processor; and
   a computer memory operatively coupled to the computer processor, the computer memory comprising computer program instructions that, when executed by the computer processor, cause the apparatus to carry out the steps of:
   acquiring a sample waveform from the target system, including sampling the digital signal in a set of discrete, periodic, uniformly spaced samples as a time domain vector;
   applying FFT transforming the time domain vector into a frequency domain;
   analyzing the frequency domain response including calculating a magnitude response; and
   determining, based on comparing a noise value of the magnitude response to an average noise floor threshold, whether the sample waveform has spurs, including determining that the sample waveform has no spurs when the noise value of the magnitude response is below the average noise floor threshold and determining that the sample waveform has one or more spurs when the noise value of the magnitude response is above the average noise floor threshold, wherein a spur indicates unaligned data having a delayed bit flip.

6. The apparatus of claim 5, wherein the DAC and ADC pair in the target system are in a loopback connection.

7. The apparatus of claim 6, wherein the sample waveform is acquired from an output of the DAC.

8. The apparatus of claim 6, wherein the sample waveform is acquired from an output of the ADC.

9. A computer program product including a non-transitory computer readable medium, the computer program product comprising computer program instructions that, when executed, cause a target system to carry out converting an analog signal to a digital signal, wherein the target system includes a digital to analog converter (DAC) and analog to digital converter (ADC) pair;
   wherein the computer program instructions, when executed, further cause a computer to carry out:
   acquiring a sample waveform of the digital signal including a set of discrete uniformly spaced samples from the target system, wherein the sample waveform is a time domain vector;
   applying FFT transforming the time domain vector into a frequency domain;
   analyzing the frequency domain response including calculating a magnitude response; and
   determining, based on comparing a noise value of the magnitude response to an average noise floor threshold, whether the sample waveform has spurs, including determining that the sample waveform has no spurs when the noise value of the magnitude response is below the average noise floor threshold and determining that the sample waveform has one or more spurs when the noise value of the magnitude response is above the average noise floor threshold, wherein a spur indicates unaligned data having a delayed bit flip.

10. The computer program product of claim 9, wherein the DAC and ADC pair in the target system are in a loopback connection.

11. The computer program product of claim 10, wherein the sample waveform is acquired from an output of the DAC.

12. The computer program product of claim 10, wherein the sample waveform is acquired from an output of the ADC.

* * * * *